United States Patent [19]

Higeta et al.

[11] Patent Number: 5,351,211
[45] Date of Patent: Sep. 27, 1994

[54] SEMICONDUCTOR INTEGRATED CIRCUIT DEVICE HAVING CIRCUIT INSPECTION FUNCTION

[75] Inventors: Keiichi Higeta; Sohei Omori; Yasuhiro Fujimura, all of Ome; Etsuko Iwamoto, Hamura; Akihisa Uchida, Kokubunji, all of Japan

[73] Assignee: Hitachi, Ltd., Tokyo, Japan

[21] Appl. No.: 95,204

[22] Filed: Jul. 23, 1993

[30] Foreign Application Priority Data

Jul. 23, 1992 [JP] Japan ................... 4-196646

[51] Int. Cl.5 ............... G11C 7/00; G11C 29/00
[52] U.S. Cl. ............... 365/189.05; 365/194; 365/201; 365/233
[58] Field of Search ............... 365/189.05, 201, 194, 365/233, 189.07, 189.08

[56] References Cited

U.S. PATENT DOCUMENTS

| | | | |
|---|---|---|---|
| 4,128,900 | 12/1978 | Lappington | 365/189.05 |
| 4,392,105 | 7/1983 | McLeod | 324/57 DE |
| 4,489,272 | 12/1984 | McLeod | 324/73 R |
| 4,575,824 | 3/1986 | Tanaka et al. | 365/189.05 |
| 4,608,669 | 8/1986 | Klara et al. | 365/201 |
| 4,849,973 | 7/1989 | Kubota | 365/201 |
| 4,962,500 | 10/1990 | Nakagawa | 365/201 |
| 5,077,690 | 12/1991 | Smith | 365/201 |
| 5,291,449 | 3/1994 | Dehara | 365/201 |

Primary Examiner—Eugene R. LaRoche
Assistant Examiner—Tan Nguyen
Attorney, Agent, or Firm—Antonelli, Terry, Stout & Kraus

[57] ABSTRACT

An integrated circuit including latch circuits disposed on the input and output sides of an object circuit the delay time of which is to be measured, respectively, and a variable delay circuit capable of arbitrarily delaying a timing signal supplied from outside or a timing signal generated inside the integrated circuit by an instruction from outside. The timing signal and a delay signal obtained by delaying the input signal by the variable delay circuit are supplied as clock signals to the latch circuits, and the signal passing through the variable delay circuit is fed back to the input side so as to constitute an oscillation circuit, the oscillation signal of which can be outputted to outside. A signal delayed by a desired time can be automatically generated inside the semiconductor integrated circuit on the basis of this timing signal.

20 Claims, 12 Drawing Sheets

SEMICONDUCTOR INTEGRATED CIRCUIT DEVICE HAVING CIRCUIT INSPECTION FUNCTION

BACKGROUND OF THE INVENTION

This invention relates generally to semiconductor integrated circuit technique and more specifically, to semiconductor integrated circuit technique which will be particularly effective when applied to an inspection system of a delay time of a semiconductor integrated circuit. Further, the present invention relates to technique which will be effective when utilized for a semiconductor integrated circuit having memories and logic circuits, for example, embedded therein.

To evaluate a semiconductor chip by measuring a delay time, etc., of a circuit or circuits inside a semiconductor integrated circuit device, it has been a customary practice to generate a timing signal for the test by an external testing equipment (such as a tester) and to apply the signal to the semiconductor integrated circuit device. However, if all the timing signals necessary for testing the semiconductor integrated circuit device are generated by the external testing equipment, a load to the testing equipment increases and the cost of such equipment becomes high. Further, if the test is carried out by the use of the timing signals generated primarily by the external testing equipment, wrong diagnosis might occur because characteristics of internal devices of the semiconductor integrated circuit device change depending on temperatures, and so forth.

Therefore, a technique which embeds a test timing generation circuit for generating the timing signals for the test into the chip has been proposed (U.S. Pat. No. 4,608,669 corresponding to JP-A-60-245275) in order to correctly judge whether or not memory arrays inside the semiconductor integrated circuit device are in match with the specification of timing and to reduce the load to the testing equipment.

The technique of measuring a delay time of a certain circuit inside an LSI chip is described in U.S. Pat. Nos. 4,489,272 and 4,392,105.

When the test timing generation circuit is embedded into the semiconductor integrated circuit device, the test timing signal generated by this test timing generation circuit, too, are affected by variance in a fabrication process and by the condition of use of the semiconductor integrated circuit device. Therefore, timing of the signals so generated must be measured by an external tester.

However, the delay time of circuits has become shorter and shorter in recent years with the progress of semiconductor fabrication technique, and the tester for measuring the delay time of the circuits must have higher accuracy. Nonetheless, the testing equipment for evaluating new high speed products fabricated by the latest process technique is constituted by using lower speed semiconductor devices fabricated by more obsolete technique. For this reason, accuracy accomplished by the testing equipment is not sufficient in some cases in comparison with the object of the test. Accordingly, the conventional semiconductor integrated circuit devices are often found defective only after they are used in practice.

The test of the semiconductor integrated circuit devices is carried out in many cases using a prober under a wafer state where they are not yet diced. However, in comparison with the test which is carried out after the semiconductor integrated circuit device is assembled into a package, the wiring length from the semiconductor integrated circuit device to the testing equipment is greater in the probing test and hence, a greater impedance is applied to the semiconductor integrated circuit device. This invites the drop of measurement accuracy of test timing. Accordingly, there is also the case where the semiconductor integrated circuit device is found defective by the test after it is assembled into the package. In other words, since the package assembly work, which is originally not necessary, is carried out in vain, the cost of production becomes higher.

SUMMARY OF THE INVENTION

It is an object of the present invention to provide semiconductor integrated circuit technology which makes it possible to measure highly accurately the delay time of a circuit or circuits inside a semiconductor integrated circuit device by a probing test without using a high precision tester or testing equipment, and thus to reduce the cost of the testing equipment as well as the unit price of the semiconductor integrated circuit device.

It is another object of the present invention to provide a chip embedded circuit which can discover defective circuit portions which cannot be found not by a probing test carried out under an LSI chip state, by measurement having a higher level of accuracy.

The above and other objects and novel features of the present invention will become more apparent from the following description when taken in conjunction with the accompanying drawings.

The following will briefly represents typical inventions among the inventions described herein.

Latch circuits are disposed on the input and output sides of a to-be-inspected circuit such as a memory circuit the delay time of which is desired to be measured, respectively, and a variable delay circuit capable of arbitrarily delaying a test timing signal supplied from outside or a timing signal T1 generated inside the semiconductor integrated circuit device, by an instruction from outside, is also disposed. Delay timing signals TA and TB are supplied as clock signals to the latch circuits, respectively. Further, a line for feeding back the output signal of the variable delay circuit to the input terminal of the variable delay circuit is so disposed as to constitute an oscillation circuit, and the oscillation signal of this oscillation circuit can be outputted to the outside.

According to the means described above, the delay timing signals TA and TB, which are delayed by a desired time with respect to one test timing signal T1, can be automatically generated by the variable delay circuit disposed inside the semiconductor integrated circuit device. Accordingly, a load to a testing equipment can be reduced much more than when the delay timing signal is generated outside the semiconductor integrated circuit device and is then supplied to it. Further, since the oscillation signal from the oscillation circuit constituted by the variable delay circuit can be outputted to outside, the delay time difference between the delay timing signals TA and TB can be known by merely measuring the frequency of the oscillation signal by an external tester. Accordingly, high precision measuring equipment becomes unnecessary in comparison with the case where the delay time or in other words, the delay time which is set to the variable delay time, is directly measured, and the cost of the testing equipment can be reduced.

Since the delay time of the memory circuit or the logic circuit inside the semiconductor integrated circuit device can be measured with a high level of accuracy by the probing test, whether the semiconductor integrated device is an approved product or a rejected product can be determined without carrying out the test after it is assembled to the package. Accordingly, the unnecessary assembling work to the package can be eliminated and the unit price of the semiconductor integrated circuit device can be lowered.

DESCRIPTION OF THE PREFERRED EMBODIMENTS

Hereinafter, preferred embodiments of the present invention will be explained with reference to the accompanying drawings.

Figure 1:
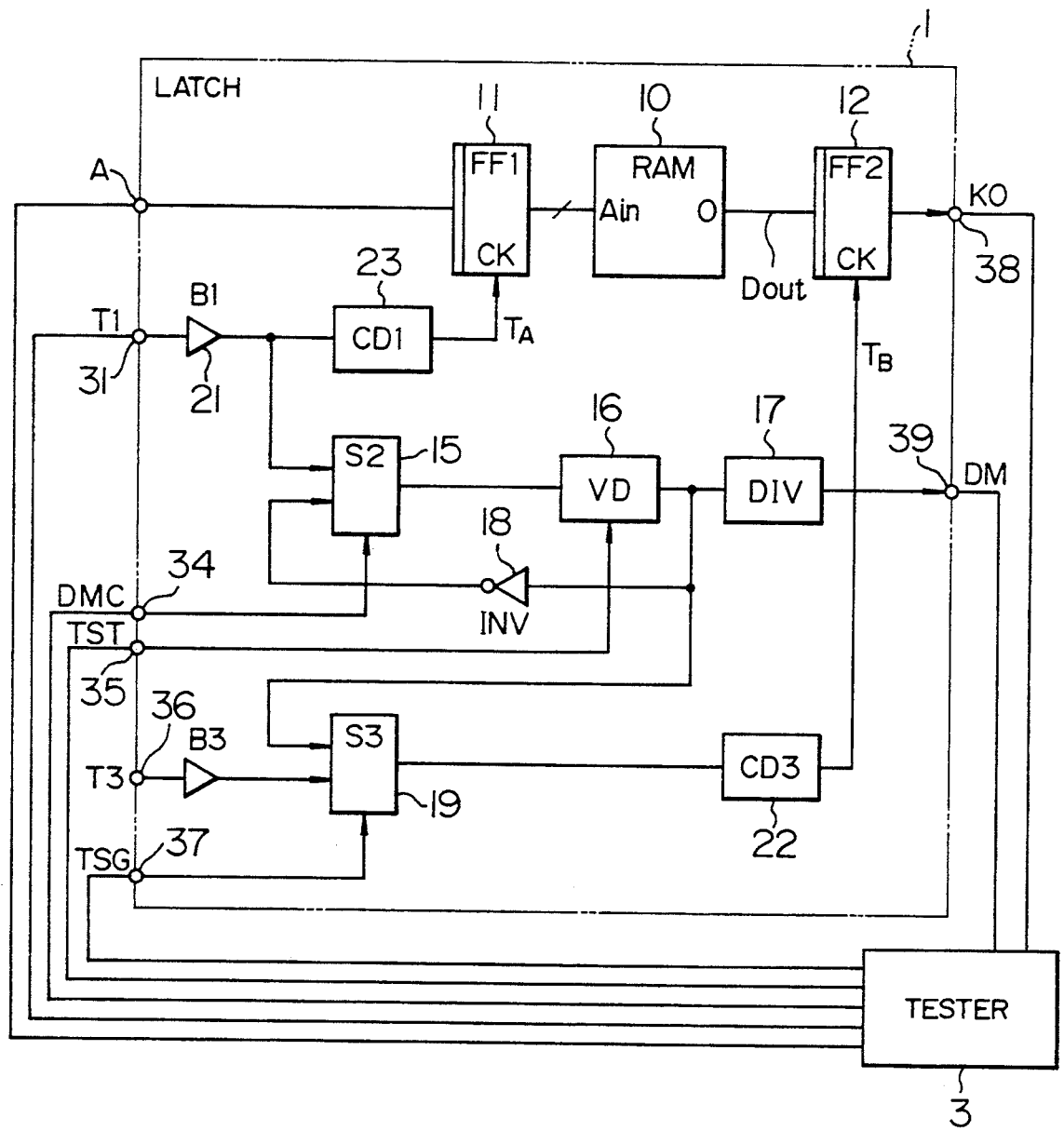
FIG. 1 is a block structural view showing an embodiment wherein the present invention is applied to a semiconductor integrated circuit device with a built-in memory.

FIG. 1 shows an embodiment wherein the present invention is applied to a semiconductor integrated circuit device 1 having a built-in memory. The semiconductor integrated circuit device represented by one-dot-chain line in the drawing is integrally formed on one semiconductor substrate such as single crystal silicon. Incidentally, the drawing depicts only the portion of the semiconductor integrated circuit device 1 which is associated with a test, and other circuits not associated with the test are omitted from the drawing.

In FIG. 1, reference numeral 10 denotes a memory portion as a to-be-inspected circuit comprising a memory array, an address decoder and a read/write circuit. An address latch circuit 11 for inputting and holding an address signal A is disposed on the input side (Ain) of this memory portion 10. An output latch circuit 12 for testing, which inputs and holds the data signal Dout read out from the memory array is disposed on the output side (0) of the memory portion 10. A write circuit has a known structure, and after predetermined data is written in advance, a latch operation and measurement of an oscillation frequency are carried out in the following way.

In this embodiment, a test timing signal T1 generated by an external tester 3 is supplied to an external input terminal 31 and is inputted to a clock terminal of the latch circuit 11 described above through a buffer B1 and through a clock distribution circuit CD23. The latch circuit 11 is constituted in such a fashion as to input and hold the address signal A in synchronism with the test timing signal T1 supplied thereto.

The clock distribution circuit CD1 distributes and supplies one test timing signal $T_A$ to a plurality of latch circuits 11 disposed so as to correspond to each bit of the address signal A having a plurality of bits. The test timing signal T1 is supplied to a variable delay circuit VD16 through a selection circuit S2, and is also supplied, as a signal $T_B$, to the latch circuit 12 disposed on the output side of the memory 10, through a selection circuit S3 and the clock distribution circuit CD3.

The clock distribution circuit CD3 distributes and supplies the test timing signal $T_B$ to a plurality of latch circuits 12 so disposed as to correspond to each bit of a read data signal (Dout) having a plurality of bits. The data latched by the latch circuits 12 is outputted to the tester 3 from an external output terminal KO.

In the semiconductor integrated circuit device shown in FIG. 1, a delay time $\Delta t = t_B - t_A$ between the signals $T_A$ and $T_B$ is the difference obtained by subtracting the delay time t pdCD1 of the clock distribution circuit CD1 from the sum of the delay time t pdS2 of the selection circuit S15, the delay time t pdVD of the variable delay circuit VD, the delay time t pdS3 of the selection circuit S3 and the delay time t pdCD3 of the clock distribution circuit CD3, that is, (t pdS2+t pdVD+t pdS3+t pdCD3). Assuming hereby that t pdCD1=t pdCD3 and that t pdS2 and t pdS3 are sufficiently smaller than t pdVD, the delay time Δt is substantially equal to t pdVD. Accordingly, when an access is made to the memory 10 by inputting the address signal A to the latch circuit 11 by the test timing signal T1, a correct read data Dout is latched by the latch circuit 12 only when the access time of the memory 10 is smaller than the delay time Δt.

The selection circuit S2 is switched by the selection signal DMC inputted from the tester 3 to the external input terminal 34. The delay time of the variable delay circuit VD can be changed by a control signal TST having a plurality of bits, which is inputted from the tester 3 to the external input terminal 35.

On the other hand, as the selection circuit S2 is switched by the selection signal DMC, the output signal of the variable delay circuit VD is inserted by an inverter INV18, and the inverted signal is fed back to the input side of the variable delay circuit VD. In this way, an oscillation circuit like a ring oscillator is constituted. The oscillation frequency of this ring oscillator is (t pdS2+t pdVD+t pdINV)$^{-1}$ when the delay time of the inverter INV is t pdINV. When t pdS2 and t pdINV are sufficiently smaller than t pdVD, the oscillation frequency of the ring oscillator 2 t pdVD$^{-1}$. Accordingly, t pdVD can be known by measuring the oscillation frequency of the ring oscillator.

Figure 2:
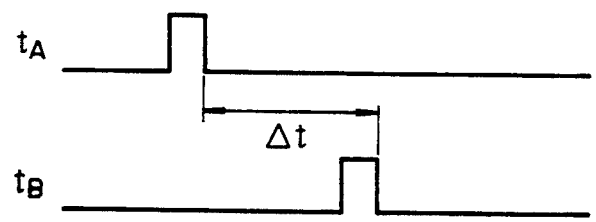
FIG. 2 is a timing chart showing relationship of timing signals for operating latch circuits that are disposed as pre- and post-stage circuits of a to-be-inspected circuit.

In FIG. 1, the frequency of the oscillation frequency of the ring oscillator inclusive of the variable frequency circuit VD is divided by two by a frequency division circuit DIV 17, though this division is not particularly limited, and is then outputted to outside from the output terminal DM. The time difference between the test timing signal $T_A$ generated by the variable delay circuit VD and is delay signal $T_B$, or in other words, the delay time $\Delta t$ (see FIG. 2), can be correctly known by measuring the frequency of the oscillation signal outputted from this output terminal DM by the external tester 3.

The delay time t pdVD=$\Delta t$ corresponding to the address access time of a high speed memory can be measured easily by the tester constituted by a low speed semiconductor integrated circuit device by lowering the frequency of the oscillation signal supplied to the tester 3 described above. Accordingly, the delay time as the address access time of the memory 10 can be correctly measured by regulating the delay time of the variable delay circuit VD by the control signal TST and measuring the delay time $\Delta t$ of the variable delay time VD when the output of the memory portion 10 is correctly latched by the latch circuit 12. Further, judgement of approved/rejected products of the semiconductor integrated circuit devices can be made by regulating the delay time $\Delta t$ of the variable delay circuit VD in such a manner as to bring it into conformity with the maximum access time of the memory 10 and judging whether or not the data of the memory portion 10 is correctly latched by the latch circuit 12, by the tester 3. As can be understood from the description given above, the circuit devices B1, CD1 and DIV in this embodiment can be omitted. In this case, the VD output is applied to CK of the latch 12 and is connected to the terminal DM.

In the embodiment described above, the test timing signal T3 inputted from the external input terminal 36 can be supplied to the latch circuit 12 on the output side through the buffer circuit B3, the selection circuit S3 and the clock distribution circuit CD3. The selection circuit S3 is switched by the selection signal TSG inputted from the tester 3 to the external input terminal 37 so that either one of the signal delayed by the variable delay circuit VD and the test timing signal T3 inputted from the external input terminal 36 is transmitted to the latch circuit 12. Since this external input terminal 36 is provided, it becomes possible to apply a control clock from outside during a normal operation and to carry out the test by inputting the test timing signal T3 which is delayed by at least the maximum delay time in the variable delay circuit VD in the test mode.

Figure 3:
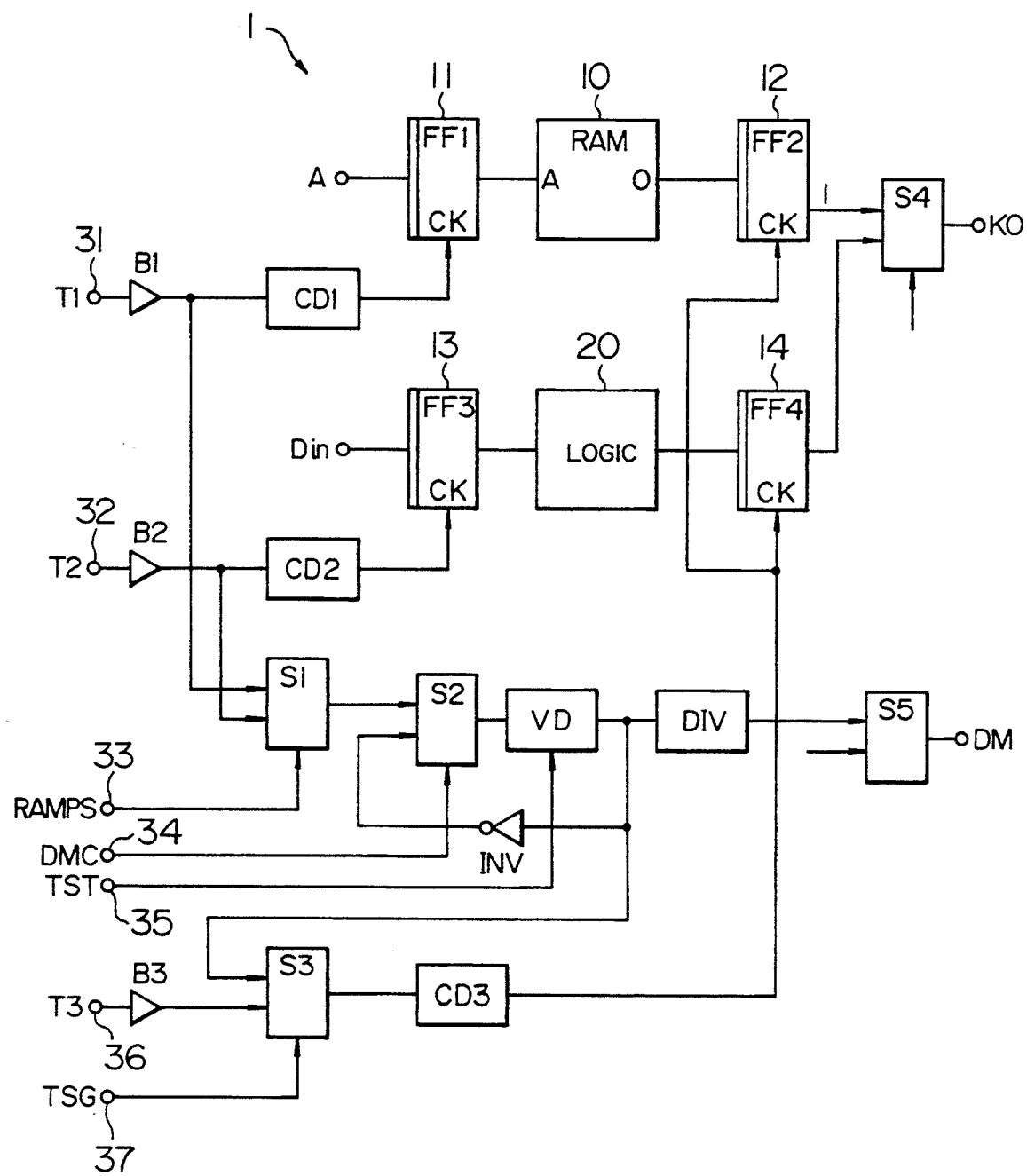
FIG. 3 is a block structural view showing another embodiment wherein the present invention is applied to a semiconductor integrated circuit device having a memory and a logic unit.

FIG. 3 shows an embodiment wherein the present invention is applied to a semiconductor integrated circuit device 1 including a memory portion 10 and a logic portion 20. The semiconductor integrated circuit device 1 shown in FIG. 3 is formed on one semiconductor substrate such as a single crystal silicon in the same way as the semiconductor integrated circuit device shown in FIG. 1. It is connected to the tester 3 during the test in the same way as shown in FIG. 1. In FIG. 3, like reference numerals are used to identify like constituent elements as in FIG. 1.

In FIG. 3, reference numeral 20 denotes a logic portion. A latch circuit 13 for inputting and holding an input data signal Din is disposed on the input side of this logic portion 20 and a latch circuit 14 for inputting and holding an output data signal is disposed on the output side of the logic portion 20.

In this embodiment, the test timing signal T1 inputted from the tester 3 to the external input terminal 31 is supplied to the clock terminal of the latch circuit 11 through the buffer B1 and the clock distribution circuit CD1. The test timing signal T2 inputted from the tester to the external input terminal 32 is supplied to the clock terminal of the latch circuit 13 through the buffer B2 and the clock distribution circuit CD2. The latch circuits 11 and 13 are so constituted as to accept the input signals and to hold them in synchronism with the test timing signals T1 and T2, respectively.

The test timing signal T1 or T2 is supplied to the variable delay circuit VD through the selection circuit S1, S2, and the delay timing signal delayed by this variable delay circuit VD is supplied to each latch circuits 12, 14 on the output side through the selection circuit S3 and the clock distribution circuit CD3. The selection circuit S1 is switched by the selection signals RAMPS and DMC inputted from the tester 3 to the external input terminal 33, and either one of the test timing signals T1 and T2 is supplied to the variable delay circuit VD.

When the selection circuit S3 is so switched by the test timing signal T1 as to test the memory portion 10, a correct read data Dout is latched by the latch circuit 12 only when the access time of the memory 10 is smaller than the delay time $\Delta t$, when the access is made to the memory 10 by applying the address signal A to the latch circuit 11 by the test timing signal T1. Accordingly, the delay time At as the address access time of the memory 10 can be measured highly accurately by regulating the delay time of the variable delay circuit VD by the control signal TST and then by measuring this delay time $\Delta t$ when the output of the memory portion 10 is correctly latched by the latch circuit 12. Furthermore, approved/rejected products of the semiconductor integrated circuit devices can be judged by regulating in advance the delay time At of the variable delay circuit VD in such a manner as to bring into conformity with the maximum access time of the memory 10 and then judging whether or not the data of the memory 10 is correctly latched by the latch circuit 12.

When the selection circuit S3 is so switched as to test the logic portion 20 by the test timing signal T2, the latch circuit 13 accepts the input data Din by the test timing signal T2 and the logic portion is operated. In this case, the correct output data Dout is latched by the latch circuit 14 only when the delay of the signal in the logic portion 20 is smaller than the delay time $\Delta t$ set to the variable delay circuit VD. Accordingly, the delay time of the logic portion 20 can be determined highly accurately by regulating the delay time of the variable delay circuit VD by the control signal TST and measuring the delay time Δt of this variable delay circuit VD when the output of the logic portion 20 is correctly latched by the latch circuit 14, from the oscillation frequency of the ring oscillator comprising the variable delay circuit VD. If the delay time Δt of the variable delay circuit VD is regulated in such a manner as to coincide with the maximum allowable delay time of the logic portion 20, judgement of the approved/rejected products of the semiconductor integrated circuit devices can be carried out by inspecting whether or not the data of the logic portion 20 is correctly latched by the latch circuit 14, using the tester 3.

In the embodiment, a selection circuit S4 is interposed between the output terminals of the latch circuits 13, 14 and the external output terminal KO so that the output data at the time of measurement of the delay time of the memory portion 10 and the output data at the time of measurement of the delay time of the logic portion 20 can be monitored by the same external output terminal KO. When a memory or memories or a logic portion the delay time of which is desired to be measured exists besides the to-be-inspected circuits (10, 20) described above and when other variable delay circuits (VD) and oscillation circuits are so disposed as to correspond to them, the selection circuit S5 makes it possible to measure the oscillation frequency of each oscillation circuit using the same terminal DM.

Figure 4:
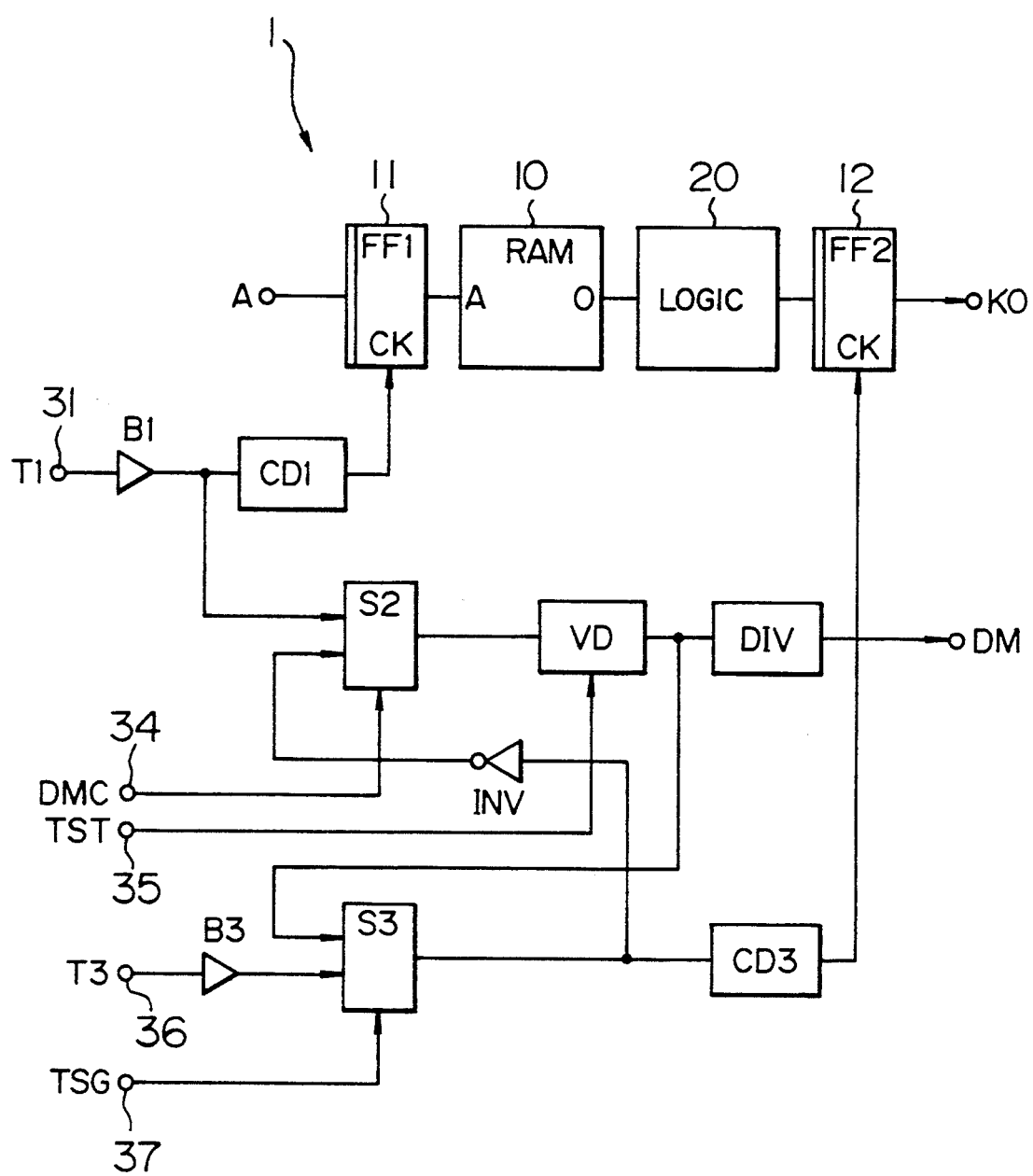
FIG. 4 is a block structural view showing another embodiment of the present invention.

FIG. 4 shows another embodiment as a modified embodiment of the embodiment shown in FIG. 1. In the semiconductor integrated circuit device 1 including the logic portion 20 such as an error check circuit disposed at the post stage of the memory portion 10, this modified embodiment collectively measures the delay in these to-be-inspected circuits 10 and 20. In the embodiment shown in FIG. 1, the output signal of the variable delay circuit VD is as such fed back to the input terminal of the variable delay circuit VD through the selection circuit S2 but in the embodiment shown in FIG. 4, the output signal of the variable delay circuit VD is fed back to the input terminal of the variable delay circuit VD through the selection circuits S3 and S2 so as to thereby constitute the ring oscillator. In this embodiment, the delay time Δt relative to the test timing signal T1 can be measured more correctly in the form containing the delay time of the selection circuit S3.

Figure 5:
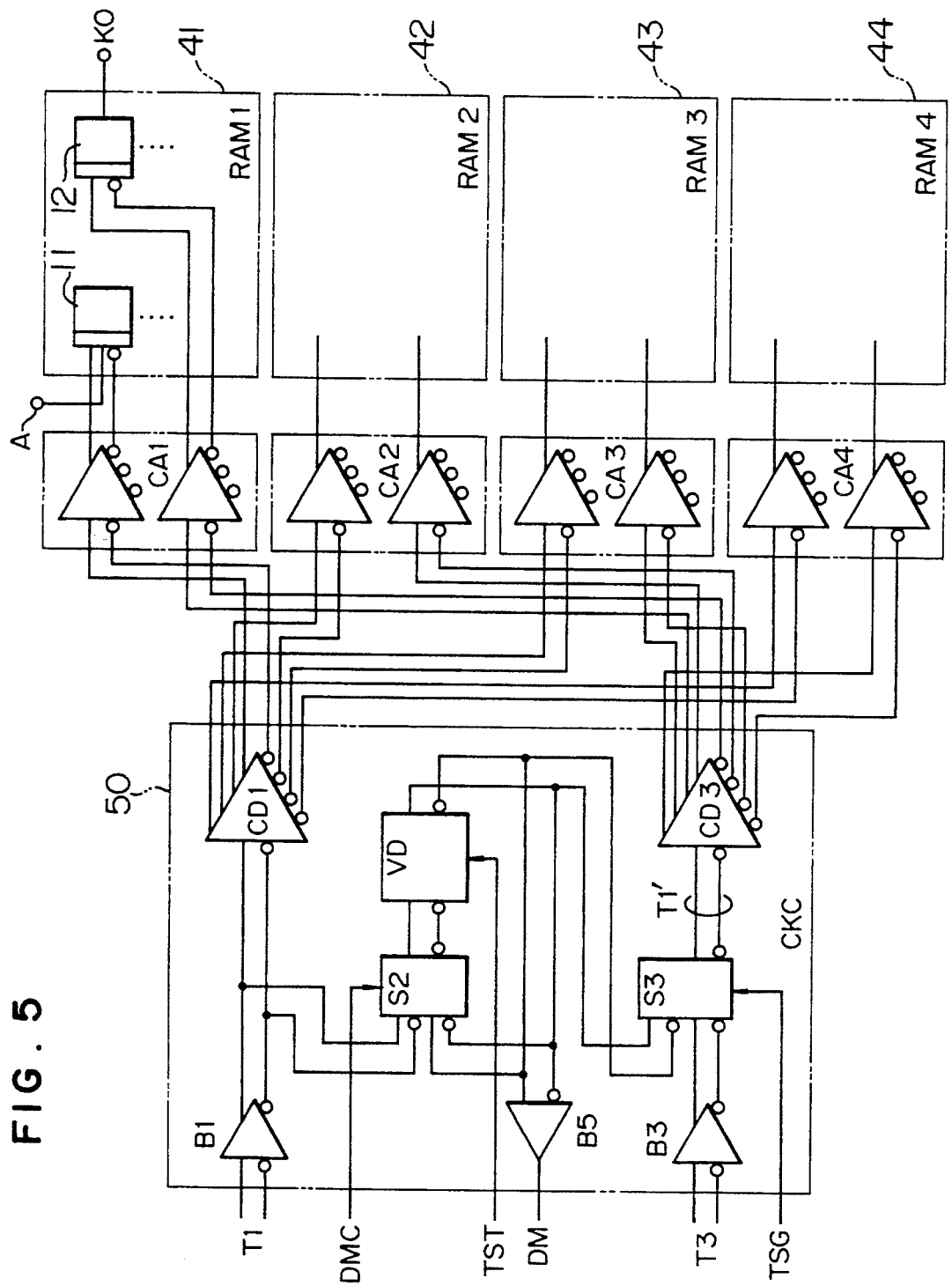
FIG. 5 is a block structural view showing still another embodiment wherein the present invention is applied to a semiconductor integrated circuit device having a plurality of RAMs built in the same chip.

FIG. 5 shows another embodiment of the present invention when it is applied to the semiconductor integrated circuit device 1 incorporating therein a plurality of RAMs (Random Access Memories) in the same chip. In this embodiment, one variable delay circuit VD is disposed for four RAMs 41, 42, 43 and 44. A flip-flop 11 for latching the address and a flip-flop 12 for latching the data are disposed in each of these RAMs 41 to 44.

The clock control circuit 50 for generating the test timing signal supplied to the flip-flops 11, 12 for inspecting the delay time of each RAM includes the buffers B1, B3 for the external timing signals T1, T3, the selection circuits S2, S3, the variable delay circuit VD and the clock distribution circuits CD1, CD3 in the same way as the embodiment shown in FIG. 1. The memory array in each of the PAMs 41 to 43 is omitted from the drawing for the purpose of illustration.

The differences of the embodiment shown in FIG. 5 from the embodiment shown in FIG. 1 reside in that a buffer B5 is disposed in place of the frequency division circuit DIV for dividing the frequency of the oscillation signal of the oscillation circuit such as the ring oscillator comprising the variable delay circuit VD so as to output as such the frequency signal, that a group of clock buffers CA1, CA2, CA3, CA4 for supplying the clocks to the flip-flops 11, 12 in the RAMs 41 to 44 are disposed as post-stage circuits of the clock distribution circuits CD1, CD3, and that the buffers B1, B3 and the clock distribution circuits CD1, CD3 comprise a differential circuit such as an ECL circuit. In this embodiment, the variable delay circuit VD comprises a differential circuit and its differential output is reversed and fed back to the input side through wirings. In this way, the feedback inverter INV shown in FIG. 1, for example, can be omitted. Accordingly, the number of the circuit devices of the clock control circuit 50 can be reduced.

In this embodiment, the clock control circuit 50 is used in common for the four RAMs 41 to 44. Therefore, in comparison with the system wherein the control circuit 50 is disposed for each RAM, this embodiment can reduce the occupying area of the clock control circuit and the number of external terminals (DMC, TEST, DM, TSG). Further, when design is made in such a manner that the length of the clock feed wirings from the clock distribution circuits CD1, CD3 to the clock buffer group CA1, CA2, CA3, CA4 is the same, the delay time resulting from the parasitic capacitance of the clock feed wirings disposed between the RAMs and the clock control circuit 50 can be made substantially the same for each RAM. According to this arrangement, the access time of each RAM 41 to 44 can be inspected at substantially the same level of accuracy.

Figure 13:
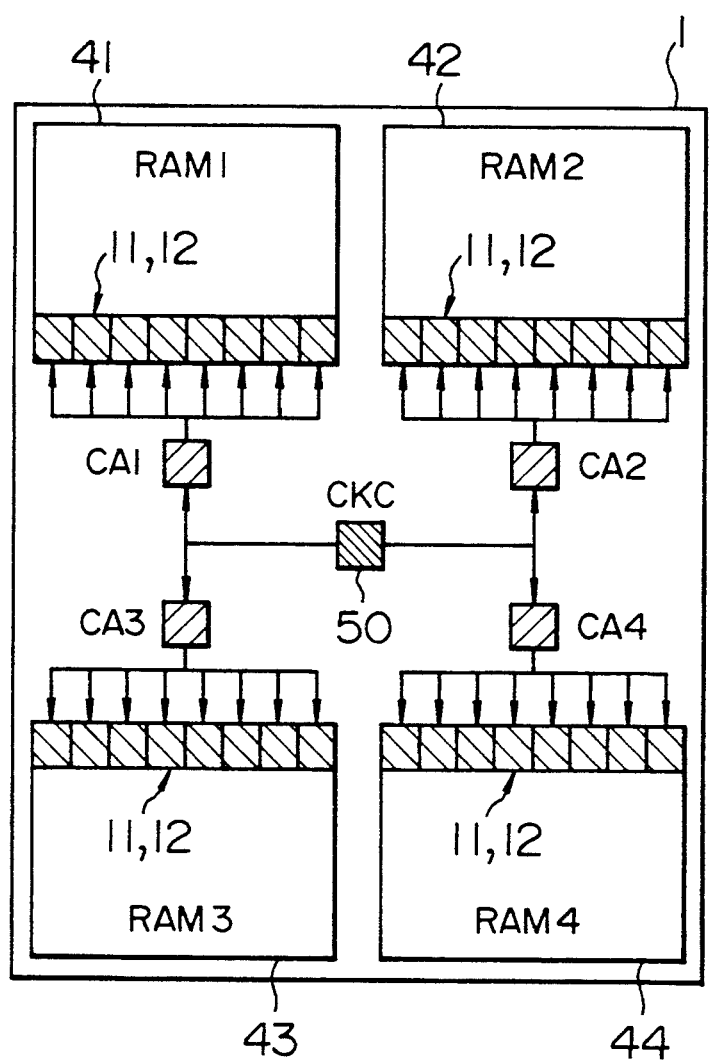
FIG. 13 is an explanatory view showing an example of a suitable layout when the present invention is applied to a semiconductor integrated circuit device employing an LOC structure as a package structure of a chip.

For example, in the layout pattern of the semiconductor substrate (chip), when the clock control circuit CKC is disposed at the center of the chip (at the position of x/2 and y/2 when x is the width of the chip and y is its length) from the sides of the chip as shown in FIG. 13, design can be made easily so that the length of the wirings from the clock distribution circuits CD1, CD3 to the clock buffer groups CA1, CA2, CA3, CA4 becomes substantially the same. When a plurality of RAMs 41 to 44 are desired to be simultaneously inspected, the clock control circuit CKC may of course be disposed for each RAM.

Figure 6:
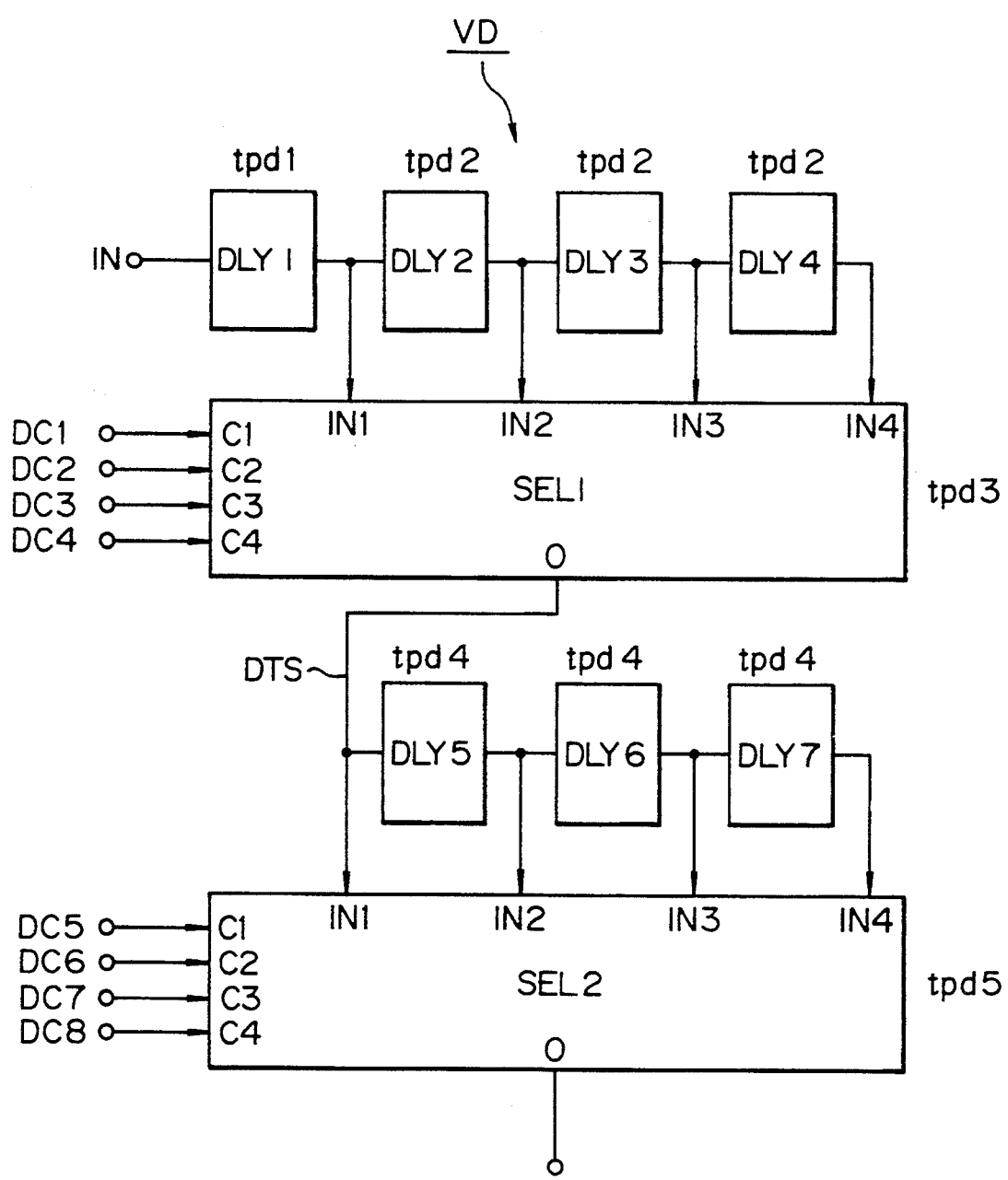
FIG. 6 is a block structural view showing an example of a variable delay circuit in the embodiment described above.

FIG. 6 shows an example of the variable delay circuits VD shown in FIGS. 1 to 5. This variable delay circuit VD comprises seven delay circuits DLY1 to DLY7 and two selection circuits SEL1, SEL2, though this arrangement is not particularly limited. The delay circuits DLY1 to DLY4 are disposed as the pre-stage circuits of the selection circuit SEL1, and the delay circuits DLY5 to DLY7 are interposed between the selection circuits SEL1 and SEL2. The selection operation of these selection circuits SEL1 and SEL2 is controlled by control level signals DC1 to DC4 and DC5 to DC8, respectively, that correspond to the control signal TST shown in FIGS. 1 to 5. Each selection circuit selects one of the four input signals and allows it to pass through the output terminal 0 of the selection circuit SEL1.

The delay circuits DLY1 to DLY4 are connected in series as shown in FIG. 6. The inputted timing signal IN is delayed by the delay circuit DLY1 and is supplied to the input terminal IN1 of the pre-stage selection circuit SEL1. Similarly, the timing signal IN is delayed by the delay circuits DLY1, DLY2 and is supplied to the input terminal IN2 of the selection circuit SEL1. Further, the timing signal IN is delayed by the delay circuits DLY1 to DLY3 and is supplied to the input terminal IN3 of the selection circuit SEL1. Still further, the timing signal IN is delayed by the delay circuits DLY1 to DLY4 and is supplied to the input terminal IN4 of the selection circuit SEL1.

Similarly, the delay circuits DLY5 to DLY7 are connected in series, and the delay timing signal DTS outputted from the pre-stage selection circuit SEL1 is supplied to the input terminal IN1 of the post-stage selection circuit SEL2. The delay timing signal DTS is delayed by the delay circuit DLY5 and is supplied to the input terminal IN2 of the selection circuit SEL2. Further, the delay timing signal DTS is delayed by the delay circuits DLY5 and DLY6 and is supplied to the input terminal IN3 of the selection circuit SEL2. Further, the delay timing signal DTS is delayed by the delay circuits DLY5 to DLY7 and is supplied to the input terminal IN4 of the selection circuit SEL2.

Among the delay circuits DLY1 to DLY7 described above, three delay circuits DLY2 to DLY4 are so constituted as to generate a delay time different from the delay time t pd1 generated by DLY1, such as a longer delay time t pd2 (t pd2>t pd1), for example, and DLY5 to DLY7 are so constituted as to generate a delay time t pd4 shorter than the delay time t pd2 (t pd4=t pd2/4), for example. In other words, the delay time of these delay circuits DLY1 to DLY7 is weighted. Accordingly, sixteen delay time can be generated step-wise with a smaller number of delay circuits as tabulated in Table 1. Incidentally, t pd3 and t pd5 in Table 1 are regarded as corresponding to the delay time of the selection circuits SEL1 and SEL2, respectively.

Coupled Logic) circuit. This delay circuit includes a current switch portion CS and emitter-follower portions EF1 and EF2. The current switch portion CS includes input differential transistors Q20 and Q21, collector resistors R21 and R22 interposed between the collectors of these transistors Q20, Q21 and a first power source voltage Vcc such as a ground potential, respectively, a constant current transistor Q22 connected to a common emitter terminal of the transistors Q20, Q21 and an emitter resistor R23 of the constant current transistor Q22. Differential input signals PI and NI are supplied to the base terminals of the transistors Q20, Q21, and a constant voltage VCST is supplied to the base terminal of the transistor Q22 so that the transistor Q22 functions as a constant current source.

Each of the emitter follower portions EF1, EF2 includes an emitter follower output transistor Q25, Q26, a constant current transistor Q27, Q28 connected to the emitter terminal of the transistor Q25, Q26 and an emitter resistor R24, R25 interposed between the emitter terminal of the transistor Q27, Q28 and a second power source voltage Vee such as a negative potential. The collector voltage of each of the differential transistors Q20, Q21 forming the current switch CS is supplied to the base terminal of each output transistor Q25, Q26, and an output signal PO, NO is outputted from the emitter terminal of the transistor Q25, Q26. A constant voltage VCST is supplied to the base terminal of each transistor Q27, Q28 and the transistor functions as a

TABLE 1

| No. | DC1 | DC2 | DC3 | DC4 | DC5 | DC6 | DC7 | DC8 | Delay time | | | | | |
| --- | --- | --- | --- | --- | --- | --- | --- | --- | --- | --- | --- | --- | --- | --- |
| 1 | H | L | L | L | H | L | L | L | tpd1 | | | + tpd3 | | + tpd5 |
| 2 | H | L | L | L | L | H | L | L | tpd1 | | | + tpd3 | + | tpd4 + tpd5 |
| 3 | H | L | L | L | L | L | H | L | tpd1 | | | + tpd3 | + | 2 tpd4 + tpd5 |
| 4 | H | L | L | L | L | L | L | H | tpd1 | | | + tpd3 | + | 3 tpd4 + tpd5 |
| 5 | L | H | L | L | H | L | L | L | tpd1 | + | tpd2 + tpd3 | | | + tpd5 |
| 6 | L | H | L | L | L | H | L | L | tpd1 | + | tpd2 + tpd3 | | + | tpd4 + tpd5 |
| 7 | L | H | L | L | L | L | H | L | tpd1 | + | tpd2 + tpd3 | | + | 2 tpd4 + tpd5 |
| 8 | L | H | L | L | L | L | L | H | tpd1 | + | tpd2 + tpd3 | | + | 3 tpd4 + tpd5 |
| 9 | L | L | H | L | H | L | L | L | tpd1 | + | 2 tpd2 + tpd3 | | | + tpd5 |
| 10 | L | L | H | L | L | H | L | L | tpd1 | + | 2 tpd2 + tpd3 | | + | tpd4 + tpd5 |
| 11 | L | L | H | L | L | L | H | L | tpd1 | + | 2 tpd2 + tpd3 | | + | 2 tpd4 + tpd5 |
| 12 | L | L | H | L | L | L | L | H | tpd1 | + | 2 tpd2 + tpd3 | | + | 3 tpd4 + tpd5 |
| 13 | L | L | L | H | H | L | L | L | tpd1 | + | 3 tpd2 + tpd3 | | | + tpd5 |
| 14 | L | L | L | H | L | H | L | L | tpd1 | + | 3 tpd2 + tpd3 | | + | tpd4 + tpd5 |
| 15 | L | L | L | H | L | L | H | L | tpd1 | + | 3 tpd2 + tpd3 | | + | 2 tpd4 + tpd5 |
| 16 | L | L | L | H | L | L | L | H | tpd1 | + | 3 tpd2 + tpd3 | | + | 3 tpd4 + tpd5 |

The control signals DC1 to DC4 and DC5 to DC8 correspond to the afore-mentioned control signal TST. However, instead of allocating eight terminals for inputting the control signals DC1 to DC8, it is possible to dispose a shift register and a decoder between the external input terminal 35 and the variable delay circuit VD so as to serially input a desired control data to the shift register from one external input terminal 35, and to decode the data by the decoder so as to generate the control signals DC1 to DC8. In this case, the number of external terminals for testing can be reduced.

Figure 7:
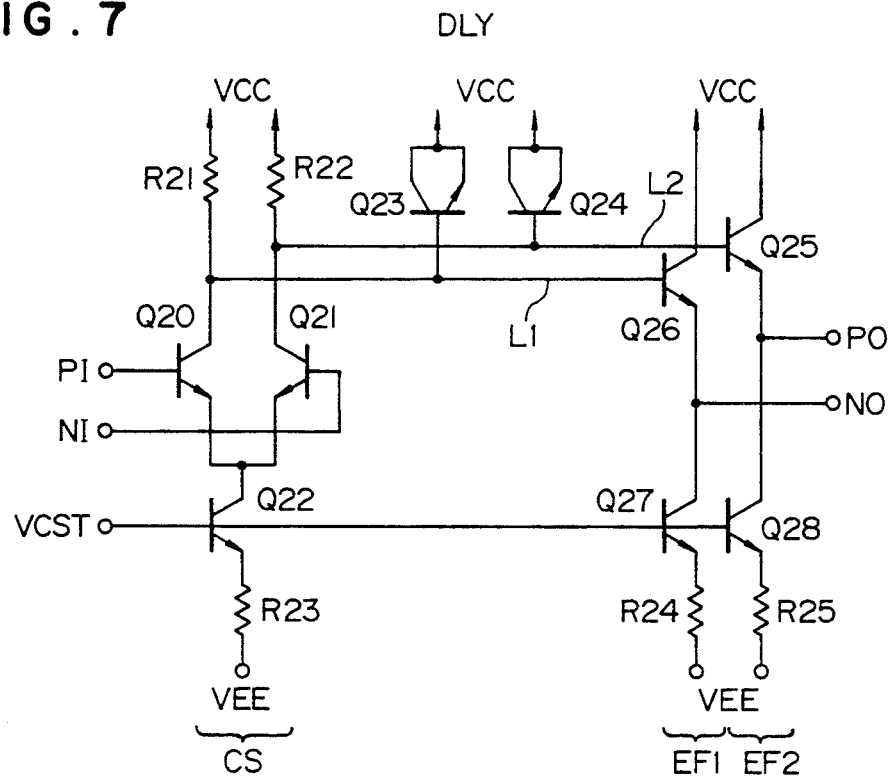
FIG. 7 is a circuit diagram showing a definite structural example of a delay circuit constituting the variable delay circuit.
Figure 8:
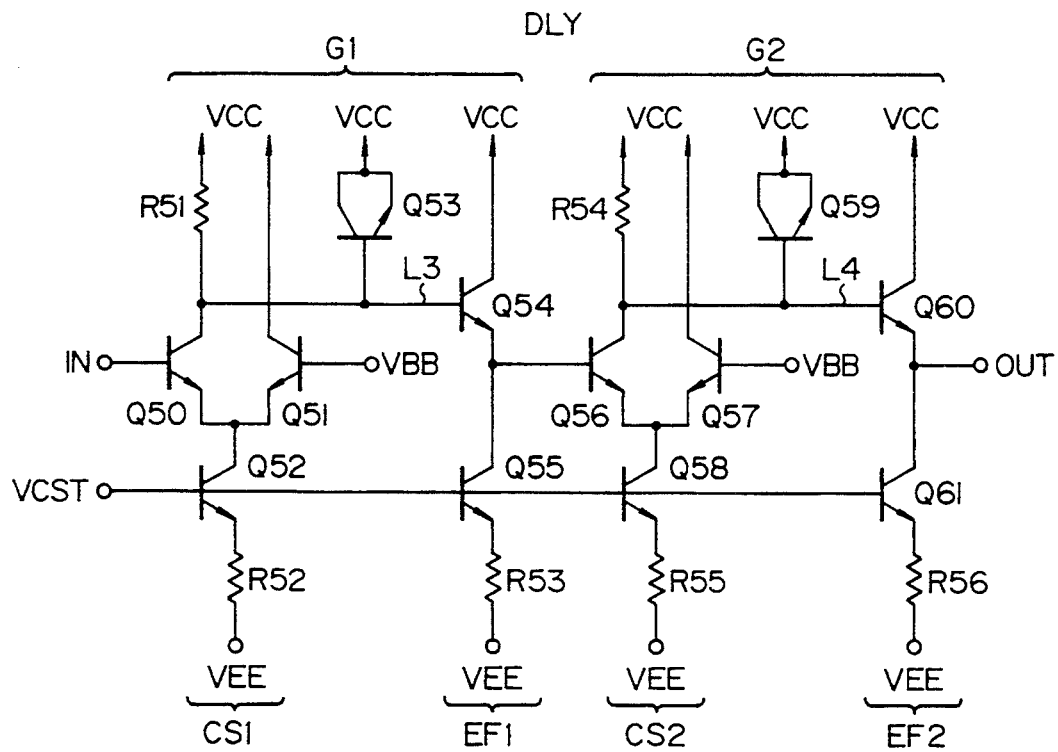
FIG. 8 is a circuit diagram showing another structural example of the delay circuit constituting the variable delay circuit.
Figure 9:
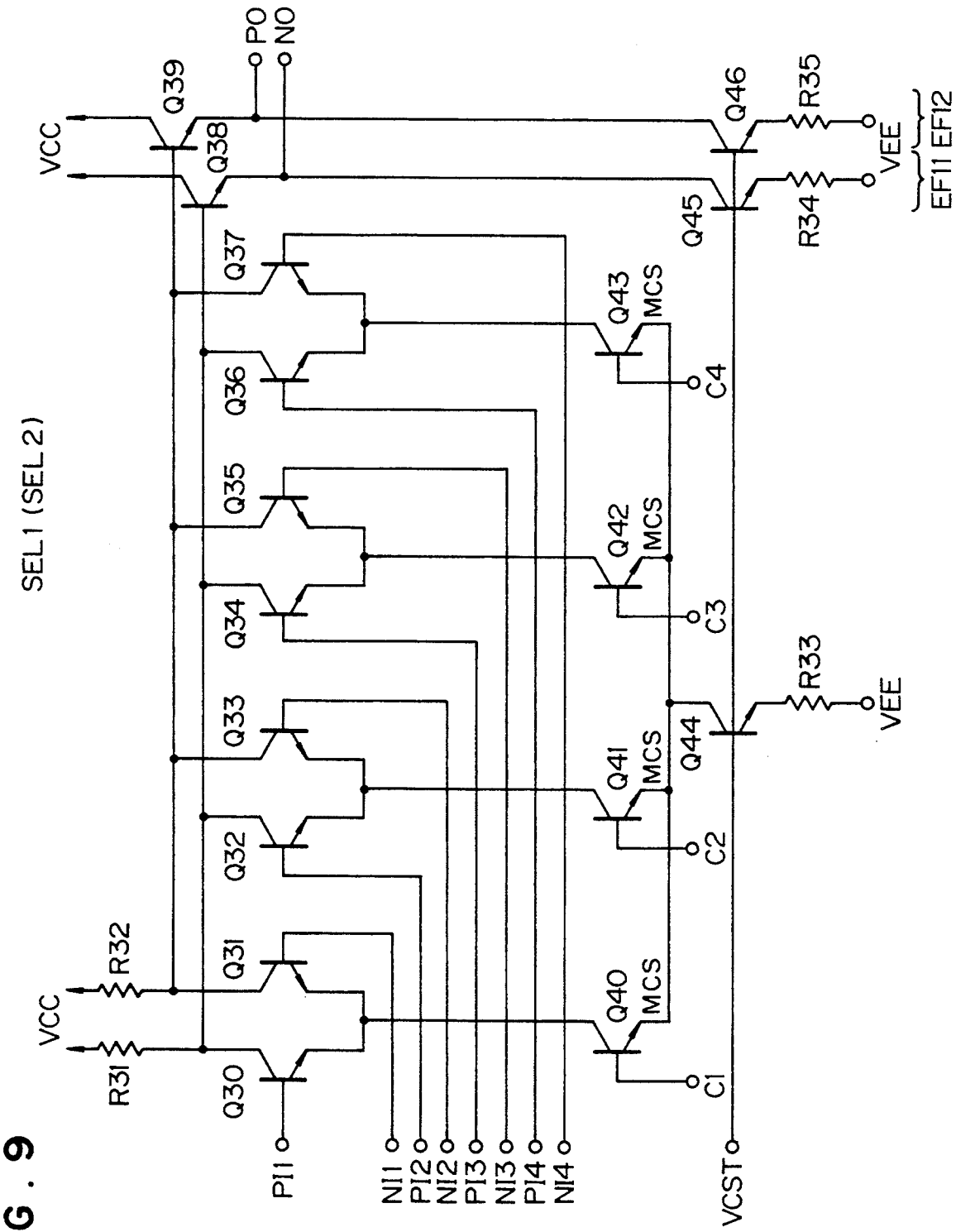
FIG. 9 is a circuit diagram showing a definite example of a selection circuit.

FIGS. 7 and 8 show a definite example of the circuit construction of the delay circuits DLY1 to DLY7 constituting the variable delay circuit VD shown in FIG. 6. FIG. 9 shows a definite example of the circuit construction of the selection circuits SEL1 and SEL2 shown in FIG. 6. FIGS. 7 to 9 show a circuit comprising bipolar transistors by way of example, though this is not limitative, and the circuit can of course be constituted by MOSFETs, resistors and capacitors.

The delay circuit 7 shown in FIG. 7 is a differential type delay circuit formed by changing an ECL (Emitter constant current source.

Each capacitance device utilizing the base capacitance of the bipolar transistor is connected at an intermediate part of a signal wiring L1, L2 disposed between the collector terminal of each differential transistor Q20, Q21 forming the current switch CS and the base terminal of each output transistor Q25, Q26 of each emitter follower EF1, EF2. The bipolar transistors Q23, Q24 are the delay device, and delay circuits having different delay time can be obtained by changing the size or number of these bipolar transistors.

The delay circuit shown in FIG. 8 represents an example of the delay circuit obtained by connecting ECL circuits having a single output in series and in two stages. The ECL circuit G1 of the pre-stage includes a current switch portion CS1 and an emitter follower portion EF1. The current switch portion CS1 includes an input differential transistor Q50, a collector resistor R51 connected between the collector of the transistor Q50 and a first power source voltage vcc, a constant current transistor Q52 connected to the common emitter terminal of the transistors Q50 and Q51, and an emitter resistor R52 of the constant current transistor Q52. The collector of the transistor Q50 is connected in series with the first power source voltage Vcc.

The input signal IN is supplied to the base terminal of the transistor Q50 and a reference voltage Vbb having a voltage value between the first power source voltage and the second power source voltage is supplied as a logic threshold voltage to the base terminal of the transistor Q51. The constant voltage VCST is supplied to the base terminal of the transistor Q52, and this transistor functions as a constant current source. The emitter follower portion EF1 includes an emitter follower output transistor Q54, a constant current transistor Q55 connected to the emitter terminal of the transistor Q54 and an emitter resistor R53 interposed between the emitter terminal of the transistor Q55 and a second power source voltage Vee such as a negative potential. The collector voltage of the differential transistor Q50 constituting the current switch CS1 is supplied to the base terminal of the output transistor Q54 so as to output the output signal of the ECL circuit G1 to the next stage from the emitter terminal of the transistor Q54.

The constant voltage VCST is supplied to the base terminal of the transistor Q55 and the transistor functions as the constant current source. A capacitance device Q53 utilizing the base capacitance of a bipolar transistor is connected to an intermediate part of a wiring L3 connecting the current switch portion CS1 and the emitter follower EF1, and this capacitance device Q53 functions as a delay device.

The ECL circuit G2 of the post-stage includes a current switch portion CS2 and an emitter follower portion EF2. The current switch portion CS2 includes an input differential transistor Q56, a collector resistor R54 connected between the collector of the transistor Q56 and the first power source voltage Vcc, a constant current transistor Q58 connected to the common emitter terminal of the transistors Q56 and Q57, and an emitter resistor R55 of this transistor Q58. The collector of the transistor Q57 is directly connected to the first power source voltage Vcc.

The output signal of the pre-stage ECL circuit G1 is supplied to the base terminal of the transistor Q56 and a reference voltage Vbb is supplied as a logic threshold voltage to the base terminal of the transistor Q57. The constant voltage VCST is supplied to the base terminal of the transistor Q58 and the transistor Q58 functions as the constant current source.

The emitter follower portion EF2 includes an emitter follower output transistor Q60, a constant current transistor Q61 connected to the emitter terminal of the transistor Q60, and an emitter resistor R56 connected between the emitter terminal of the transistor Q61 and the second power source voltage Vee such as a negative potential. The collector voltage of the differential transistor Q56 constituting the current switch CS2 is supplied to the base terminal of the output transistor Q60, and the output signal OUT is outputted from the emitter terminal of the transistor Q60.

The constant voltage VCST is supplied to the base terminal of the transistor Q61 and the transistor Q61 functions as the constant current source. A capacitance device Q59 utilizing a base capacitance of a bipolar transistor is connected as a delay device to an intermediate part of a wiring L4 connecting the current switch portion CS2 and the emitter follower EF2. Delay circuits having different delay time can be obtained by changing the size or number of these bipolar transistors Q53, Q59.

Since the ECL inverter circuits are connected in series and in two stages, this delay circuit provides the advantage that even when the reference voltage Vbb fluctuates, deviation of the total delay time becomes smaller than when one-stage ECL inverter circuit is used. In other words, when the reference voltage Vbb drops below a desired value, the delay time of the first stage inverter circuit G1 increases while the delay time of the second stage inverter circuit G1 decreases. Therefore, the total delay time of G1 and G2 can be regarded as remaining substantially unchanged. As a result, it is possible to provide a delay circuit the delay time of which hardly changes with respect to the change of the reference voltage Vbb. By the way, capacitance devices utilizing a gate capacitance of MOSFETs may be connected in place of the bipolar transistors Q53, Q59 described above.

The selection circuit shown in FIG. 9 is a circuit obtained by modifying the ELC series gate. This circuit includes four current switches (Q30, Q31), (Q32, Q33), (Q34, Q35) and (Q36, Q37) of the first stage, common collector resistors R31, R32, a constant current source (Q44, R33), a second stage current switch MCS disposed between the four current switches and the constant current source (Q44, R33) and emitter followers EF11, EF12. The second stage current switch MCS comprises transistors Q40, Q41, Q42 and Q43 the emitters of which are connected in common, and the common emitter of these transistors Q40 to Q43 is connected to the collector terminal of the transistor Q44. The constant current source comprises a transistor Q44 and a resistor R33 connected to the emitter terminal of the former, and the constant voltage VCST is supplied to the base terminal of the transistor Q44. Therefore, the transistor Q44 functions as a constant current source.

The collector terminals of the transistors Q40 to Q43 constituting the second stage current switch MCS are connected to the common emitters of the first stage current switch (Q30, Q31), (Q32, Q33), (Q34, Q35), (Q36, Q37), respectively. In the transistors of the first stage current switch, the collector terminals of Q30, Q32, Q34, Q36 are connected in common, and are connected to the first power source voltage Vcc through the common collector resistor R31. In the transistors constituting the first stage current switch, the collectors of Q31, Q33, Q35, Q37 are connected in common, and are connected to the first power source voltage Vcc through the common collector resistor R32.

Each emitter follower portion EF11, EF12 includes an emitter follower output transistor Q38, Q39, a constant current transistor Q45, Q46 connected to the emitter terminal of this transistor Q38, Q39, and an emitter resistor R34, R35 interposed between the emitter terminal of the transistor Q45, Q46 and the second power source voltage Vee such as a negative potential. The common collector voltage of the differential transistors Q30, Q32, Q34, Q36 constituting the first stage current switch is supplied to the base terminal of the output transistor Q38, and the output signal NO is outputted from the emitter terminal of the transistor Q38. The common collector voltage of the differential transistors Q31, Q33, Q35, Q37 constituting the first stage current switch is supplied to the base terminal of the output transistor Q39, and the output signal PO is outputted from the emitter terminal of the transistor Q39. By the way, the constant voltage VCST is supplied to the base terminals of the transistors Q45, Q46 and these transistors function as the constant current source.

In the selection circuit according to this embodiment, the differential input signals (PI1, NI1), (PI2, NI2), (PI3, NI3), (PI4, NI4) are inputted to the corresponding base terminals of the transistors (Q30, Q31), (Q32, Q33), (Q34, Q35), (Q36, Q37) constituting the first stage four current switches, and the selection signals C1, C2, C3, C4 are supplied to the base terminals of the transistors Q40 to Q43 constituting the second stage current switch MCS. Accordingly, a current flows through any one of the current switches of the first stage, and the differential output signals PO, NO corresponding to any one of the sets of the input signals (PI1, NI1), (PI2, NI2), (PI3, NI3), (PI4, NI4) are outputted from the emitter followers EF11, EF12.

Figure 10:
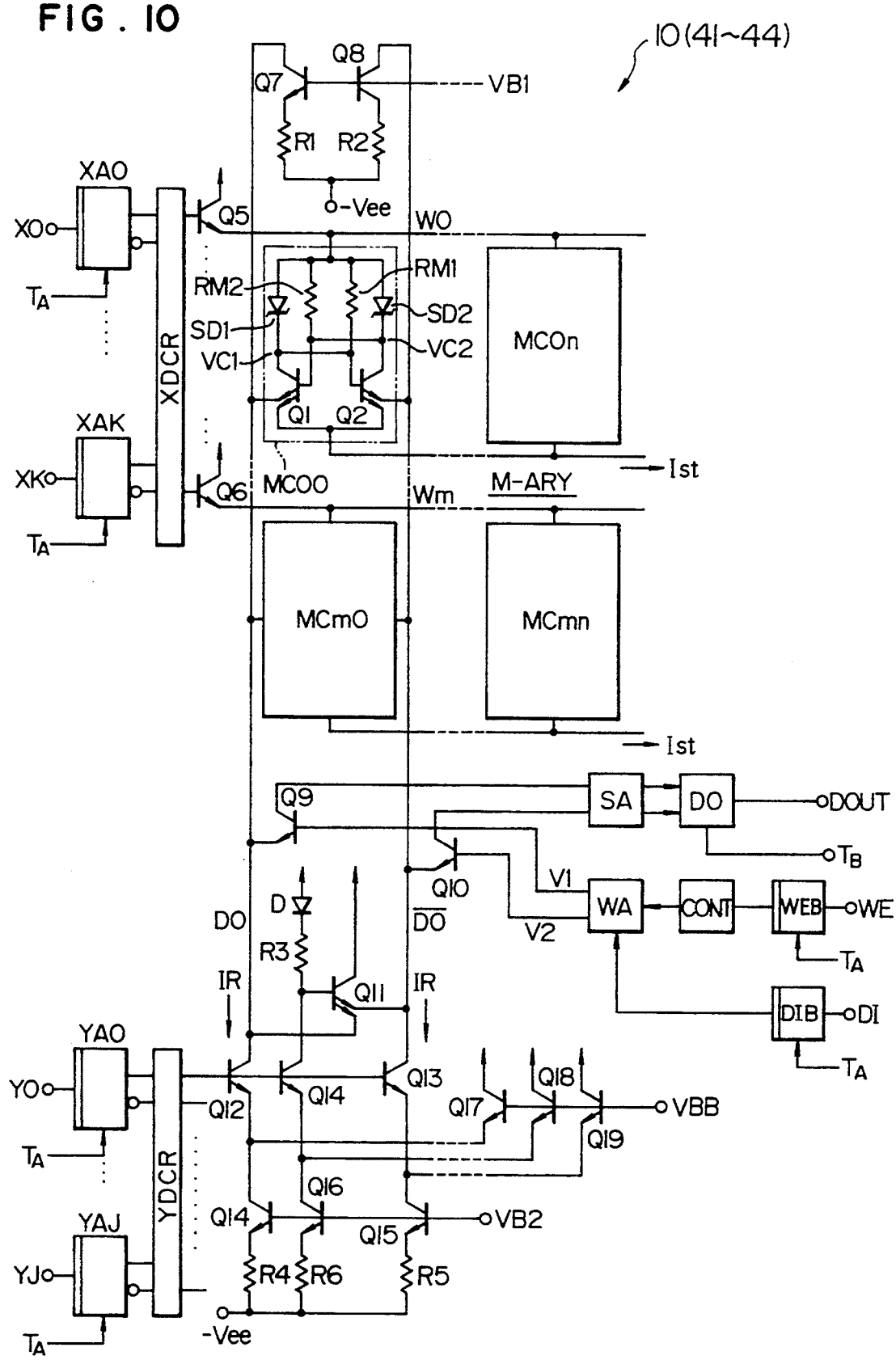
FIG. 10 is a structural circuit diagram showing an embodiment wherein the present invention is applied to a bipolar static RAM.

FIG. 10 shows a definite circuit construction of the memory 10 or the RAMs 41 to 44 shown in FIGS. 1 to 5. As shown in this circuit diagram, the memory 10 or the RAMs 41 to 44 in this embodiment are bipolar static RAMs.

In FIG. 10, symbol M-ARY represents a memory array formed by disposing in matrix Schottky barrier diode (SBD) load switch type memory cells MC00 to MCmn, XDCR represents an X decoder for selecting one word line corresponding to an X system address signal $X_0$ to $X_k$ from a plurality of word lines $W_0$ to $W_m$ inside the memory array M-ARY, YDCR represents a Y decoder for selectively turning ON column switches Q12, Q13 on a pair of bit lines corresponding to a Y system address signal $Y_0$ to $Y_j$ from among a plurality of pairs of bit lines inside the memory array M-ARY, SA represents a sense amplifier for detecting the difference of currents flowing through the selected pair of bit lines and amplifying the read data signal, WA represents a write amplifier for turning ON either one of the transistors Q1, Q2 inside the memory cell and the transistors Q9, Q10 on the bit line pair constituting the current switch on the basis of the write data signal, and for effecting write into the memory cell, and CONT represents a write control circuit for controlling the write amplifier WA on the basis of a write control signal WA given from outside.

In this embodiment, X-address-input buffer/latch circuits XA0 to XAk for inputting the X address signals X0 to Xk are disposed upstream of the X decoder XDCR, and Y-address-input buffer/latch circuits YA0 to YAj for inputting the Y address signals Y0 to Yj are disposed upstream of the Y decoder YDCR. Further, a data output buffer/latch circuit DO is disposed as the post-stage circuit of the sense amplifier SA. A write-control-signal input buffer/latch circuit WEB and a data input buffer/latch circuit DIB are further disposed as the pre-stage circuits of the write control circuit CONT and the data input amplifier DIA, respectively, though they are not particularly limitative.

Clocks (TA, TB) as the timing signals are supplied to the buffer/latch circuits XA0 to XAk, YA0 to YAj, WEB, DIB and DO from the clock control circuit CKC explained with reference to the embodiment shown in FIG. 5, for example, and they function as a test latch circuit for latching the address signal, the data signal and the control signal during the inspection of the delay time of the memory array portion. On the other hand, the buffer/latch circuit DO functions in the same way as an ordinary buffer circuit during the normal operation in which the clock supplied from the clock control circuit CKC is fixed to the low level, and outputs as such the input signal. According to this circuit arrangement, the access time of the memory (RAM) 10 during the normal operation can be improved.

Accordingly, when the latch circuits XA0 to XAk, YA0 to YAj latch the X address signals X0 to Xk and the Y address signals Y0 to YJ, one word line and a pair of bit lines are selected, and the data held by the selected memory cell is amplified by the sense amplifier SA and is latched by the latch circuit DO. Here, if any defect exists at a part of the circuit, the delay time from address latch to data latch, that is, the address access time, increases. It is therefore possible to inspect the delay time of the memory 10 and to detect any defect of the circuit by supplying the two clocks TA, TB mutually delayed by a predetermined time from the clock control circuit CKC to the latch circuits XA0 to XAk and YA0 to YAj, respectively, and judging whether or not the latch circuit can latch the correct data.

When the present invention is employed for the inspection of memory devices having a high speed access time such as the bipolar static RAMs embedded in the semiconductor integrated circuit device, the address access time of the memory devices can be measured correctly and easily using a tester constituted by a low speed semiconductor integrated circuit device.

Figure 11:
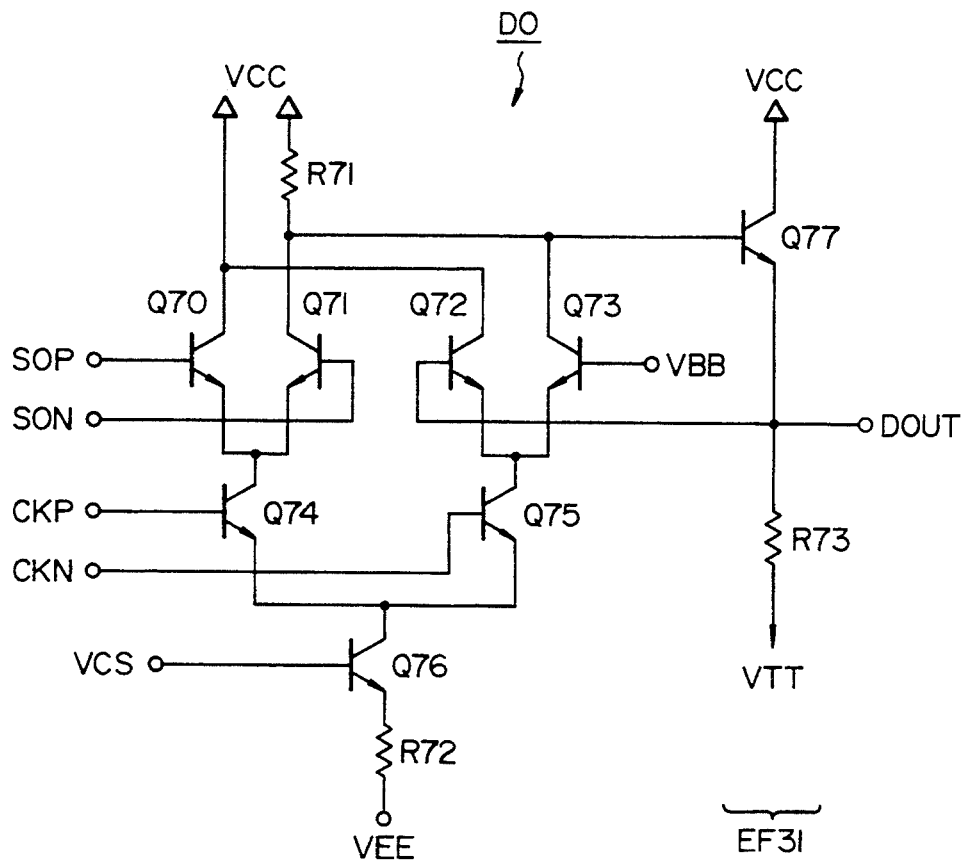
FIG. 11 is a circuit diagram showing a definite structural example of a buffer/latch circuit.

FIG. 11 shows a definite circuit construction of the buffer/latch circuit DO shown in FIG. 10. This buffer/latch circuit utilizes the ECL series gate, and includes two current switches (Q70, Q71), (Q72, Q73) of the first stage, a common collector resistor R71, a constant current source (Q76, R72), a current switch (Q74, Q75) of the second stage interposed between the two current switches and the constant current source (Q76, R72), and an emitter follower EF31. The emitters of the transistors Q74, Q75 constituting the second current switch are connected in common and the common emitter is connected to the collector terminal of the constant current transistor Q76. The constant current source comprises the transistor Q76 and the resistor R72 connected to this emitter, and the constant voltage VCST is supplied to the base terminal of the transistor Q76. Therefore, this transistor functions as the constant current source.

The collector terminals of the transistors Q74, Q75 constituting the second stage current switch are connected to the common emitter of the first stage current switches (Q70, Q71), (Q72, Q73). Among the transistors constituting the first stage current switch, the collectors of the transistors Q70 and Q72 are connected in common and then to the power source voltage Vcc. Among the transistors constituting the first stage current switch, the collector terminals of the transistors Q71 and Q73 are connected in common and then to the power source voltage Vcc through the common collector resistor R71.

The emitter follow portion EF31 includes an emitter follower output transistor Q77 and an emitter resistor R73 connected to the emitter terminal of the transistor Q77. The common voltage of the differential transistors Q71, Q73 constituting the first stage current switch is applied to the base terminal of the output transistor Q77, and the output signal DOUT is outputted from the emitter terminal of the transistor Q77.

In the buffer/latch circuit DO according to this embodiment, the differential input signals SOP, SON are applied to the base terminals Q70, Q71 of the transistors constituting the first stage current switch, the reference voltage VBB is applied to the base terminal of the transistor Q73, and the output signal DOUT is fed back to the base terminal of the transistor Q72. Complementary clock signals CKP, CKN are supplied to the base terminals of the transistors Q74, Q75 of the second stage current switch, which are disposed between the first stage current switch and the constant current transistor Q76 and the emitters of which are connected in common.

Accordingly, when the clock CKP is at the high level in this buffer/latch circuit DO, a current flows through the current switch (Q70, Q71), and the buffer/latch circuit DO accepts the differential input signals SOP, SON and outputs the output signal DOUT having a corresponding level from the emitter follower EF31. Since this output signal DOUT is fed back to the transistor Q72 of the second stage current switch (Q72, Q73), the current flows through the current switch (Q72, Q73) when the clock CKP drops to the low level and this signal stage is maintained. On the other hand, when the clock CKP is continuously kept at the high level, the current keeps flowing through the current switch (Q70, Q71), so that the circuit operates as an ordinary ECL buffer. By the way, the circuit shown in FIG. 11 can be utilized for the latch circuits XA0 to XAk and YA0 to YAj shown in FIG. 10.

Figure 12:
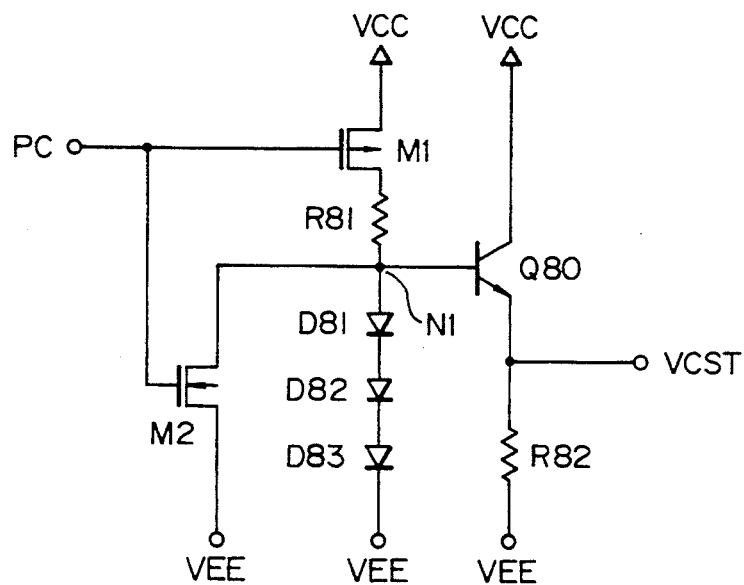
FIG. 12 is a circuit diagram showing an example of a constant voltage generation circuit for generating a constant voltage supplied to a clock control circuit.

FIG. 12 shows an example of a generation circuit for generating the constant voltage VCST supplied to the base terminal of the constant current transistor of the circuit shown in FIGS. 7 to 9. This constant voltage generation circuit comprises a reference voltage generation circuit comprising, in turn, an MOSFET M1, a resistor R81 and diodes D81, D82, D83, and connected between the power source voltages VCC and VEE, an emitter follower having a low output impedance and comprising a transistor for receiving the reference voltage (the potential at the junction node N1 between the resistor R81 and the diode D81) generated by the reference voltage generation circuit at the base terminal thereof and an emitter resistor R82 for the transistor Q80, and a control MOSFET M2 as switching means, connected between the node N1 and the power source voltage VEE.

In this constant voltage generation circuit, the control input signal PC is at the low level at the time of inspection of the delay time. Therefore, the MOSFET M1 is turned ON while the MOSFET M2 is turned OFF, so that the transistor Q80 is turned ON and a constant voltage VCST such as VEE+3Vf−VBE (where Vf is a forward voltage of each diode D81, D82, D83 and VBE is the base-emitter voltage of the transistor Q80) is generated. When VBE=Vf, the level of the constant voltage generated is VEE+2VBE.

When the control input signal PC is at the high level, on the other hand, the MOSFET M2 is turned ON while the MOSFET M1 is turned OFF. Accordingly, the transistor Q80 is turned OFF and the output voltage VCST is fixed to a level such as VEE. As a result, the constant current source of the circuit receiving this voltage (see FIGS. 7 to 9) is cut off, hence, consumed power of the clock control circuit 50 when inspection of the delay time is not effected can be reduced. In other words, consumed power of the variable delay circuit VD used only for the inspection of the delay time inside the clock control circuit 50 is made to zero during the normal operation of the semiconductor integrated circuit device, and overall consumed power of the semiconductor integrated circuit device can be reduced.

Figure 14:
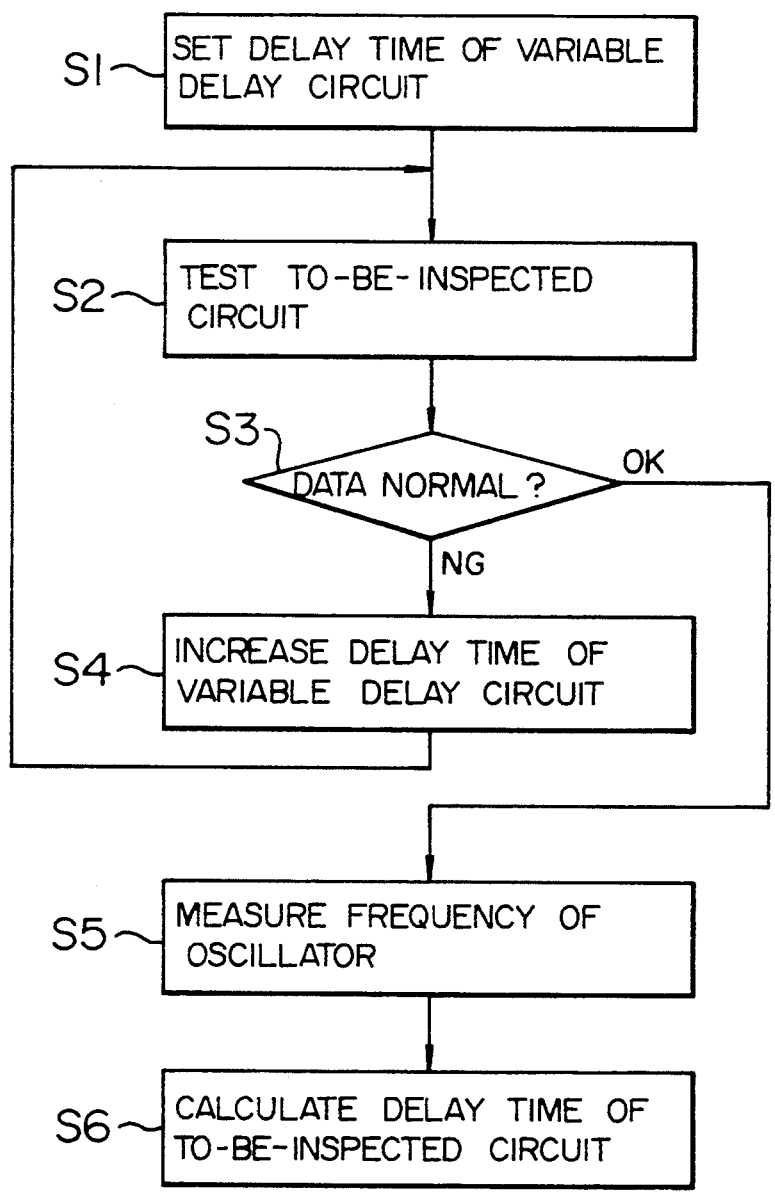
FIG. 14 is a flowchart showing an example of a measurement method of a delay time of a to-be-inspected circuit.
Figure 15:
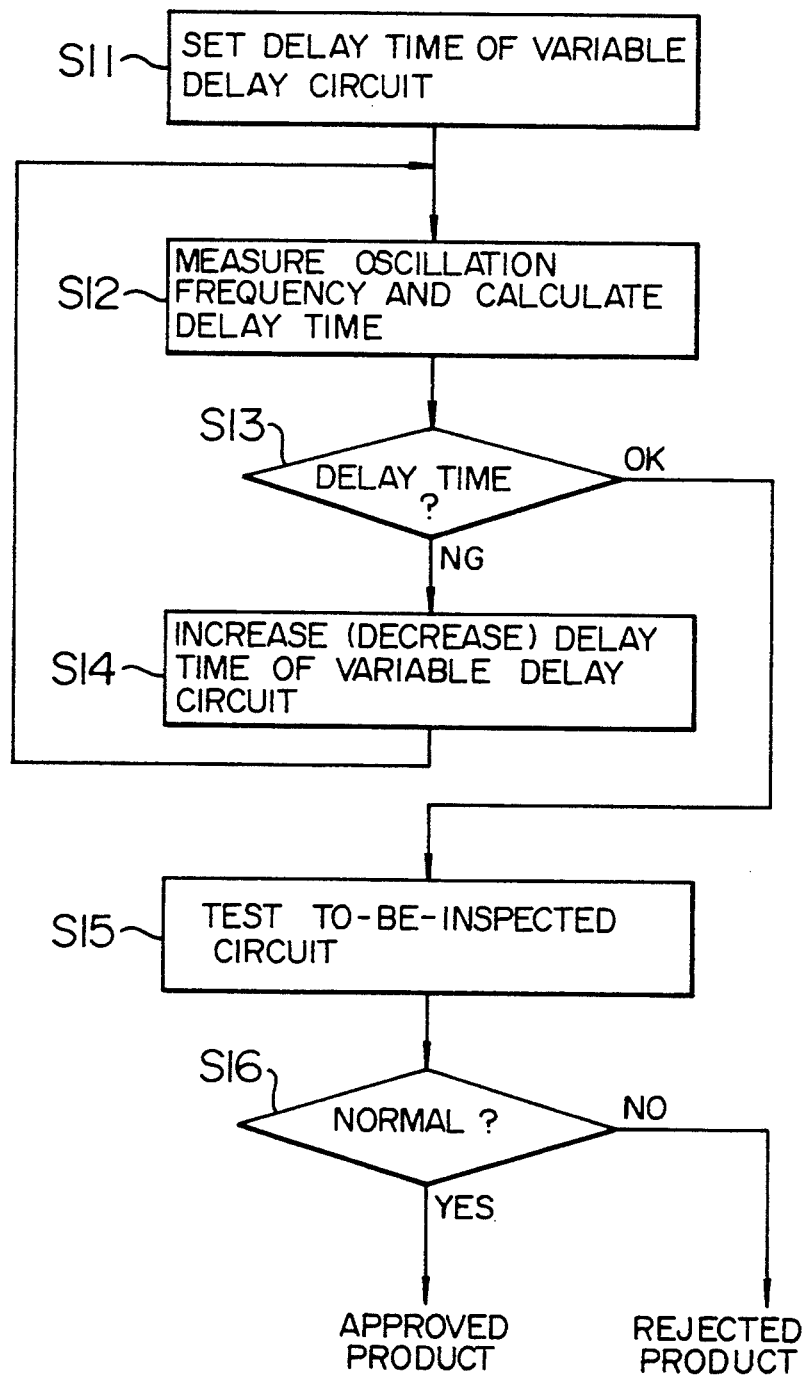
FIG. 15 is a flowchart showing an example of a judgement method of approved/rejected products of semiconductor integrated circuit devices.

Next, the method of diagnosing the semiconductor integrated circuit device, to which the present invention is applied, will be explained with reference to FIGS. 14 and 15. FIG. 14 shows the measurement method of the delay time of the to-be-inspected circuit and FIG. 15 shows the judgement method of approved and rejected products of the semiconductor integrated circuit devices.

When the delay time of the to-be-inspected circuit 10 shown in FIG. 1 is measured, for example, the control signal TST is outputted from the tester 3 and the delay time of the variable delay circuit VD is set to minimum (step S1). Next, the timing signal T1 is inputted from the tester 3 and the to-be-inspected circuit 10 is operated. Then, whether or not the latch circuit 12 to which the timing signal T is supplied latches the output data correctly is examined by the tester 3 (Steps S2, S3). When the output data latched by the latch circuit 12 is judged as wrong, the flow shifts to the Step S4. The control signal TST which increases the delay time of the variable delay circuit VD by one step is outputted from the tester 3 and the flow returns again to the Step S2, where the to-be-inspected circuit 10 is again operated and the test is carried out.

When the output data of the to-be-inspected circuit 10 is judged as being correctly latched by the latch circuit 12, the control signal DMC is outputted from the tester 3 to switch the selection circuit S2, and the output signal of the variable delay circuit VD is fed back to the input terminal of the variable delay circuit VD through the inverter INV so as to constitute an oscillation circuit such as a ring oscillator and to allow it to operate as the ring oscillator. The oscillation signal of the ring oscillator is outputted to the external terminal DM and its frequency is measured by the tester 3 (Step S5). The tester 3 has the function of counting the number of times of inversion of the oscillation signal. The delay time of the to-be-inspected circuit 10 can be measured by counting the delay time of the variable delay time VD from this frequency (Step S6).

On the other hand, in order to judge whether the semiconductor integrated circuit device shown in FIG. 1 is an approved product or a rejected product, the control signal TST is outputted first from the tester 3 and the delay time of the variable delay time VD is set to minimum (or maximum) (Step S11), as shown in FIG. 1. Next, the output of the variable delay circuit VD is fed back to the input terminal of the variable delay circuit VD through the inverter INV so as to constitute the oscillation circuit such as the ring oscillator and to allow it to operate as the ring oscillator. The oscillation signal of this ring oscillator is outputted to the external terminal DM and its frequency is measured by the tester 3 (Step S12). The delay time of the variable delay time VD is calculated, and whether or not this delay time coincides with the maximum allowable delay time required for the to-be-inspected circuit 10 is judged by measurement using the tester (Step S13).

When they do not coincide, the control signal TST is outputted from the tester 3 at the Step S14, and the delay time of the variable delay time VD is increased (or decreased) by one step. Then, the flow returns to the Step S12, and the frequency of the oscillation signal of the ring oscillator is again measured so as to calculate the delay time of the variable delay time VD. If the delay time coincides with the maximum allowable delay time required for the to-be-inspected circuit 10, the control signal DMC is outputted from the tester 3 to switch the selection circuit S2. The timing signals TA and TB are supplied to the to-be-inspected circuit 10 by inputting the timing signal T1 from the tester 3 and the to-be-inspected circuit 10 is operated. Whether or not the latch circuit 12 for receiving the timing signal T correctly latches the output data is examined by the tester 3 (Steps S15 and S16). When the data latched by the latch circuit 12 is wrong, the semiconductor integrated circuit device is judged as the rejected product, and when the output data latched by the latch circuit 12 is correct, the semiconductor integrated circuit device is judged as the approved product.

As described above, this embodiment disposes the latch circuits 11 and 12 on the input and output sides of the to-be-inspected circuit 10 the delay time of which is to be inspected, respectively, and disposes further the variable delay circuit capable of arbitrarily delaying the timing signal T1 supplied from the external tester 3 or the timing signal generated inside in accordance with the instruction of the tester 3. The timing signal TA described above and the delay timing signal TB delayed by the variable delay circuit are supplied as the clock signals to the latch circuits 11 and 12, respectively, and the output signal T of the variable delay circuit is fed back to the input terminal of the variable delay circuit so as to constitute the oscillation circuit such as the ring oscillator. The oscillation signal of this oscillation circuit can be outputted from the external terminal DM to the tester 3. Accordingly, the signals TA and TB delayed by a desired time on the basis of one timing signal T1 can be automatically generated inside the semiconductor integrated circuit device. Accordingly, in comparison with the case where such delay timing signals are generated outside the semiconductor integrated device and are supplied to the latter, the load to the tester 3 as the test equipment can be reduced. Moreover, since the delay time Δt of the timing signal T from the timing signal TA can be known by merely measuring the frequency of the oscillation frequency from the oscillation circuit by the tester 3, measuring equipment having high accuracy becomes unnecessary in comparison with the case where the delay time is directly measured. For this reason, the cost of the tester 3 as the test equipment can be reduced.

According to the present invention, the delay time of the to-be-inspected circuit 10 inside the semiconductor integrated circuit device can be measured highly accurately by the probing test. Therefore, whether the semiconductor integrated circuit device is the approved product or the rejected product can be judged without carrying out the tester after assembling it to a package. Since the assembly step of the package can thus be eliminated, the production cost or the unit price of the semiconductor integrated circuit device can be reduced.

Though the present invention has thus been described definitely with reference to some preferred embodiments thereof, the invention is not particularly limited thereto but can of course be changed or modified in various ways without departing from the scope thereof. For example, the timing signals (T1, T2) for operating the latch circuit on the input side of the to-be-inspected circuit 10 are given from outside in the embodiments described above, they can be generated inside the chip. In other words, the present invention can be similarly practiced when the oscillation circuit for generating the timing signals T1, T2 is disposed inside the semiconductor integrated circuit device, too.

Though the present invention has been described mainly about the case where the invention is applied to the semiconductor integrated circuit device having a memory embedded therein as the background of the present invention, the invention is not limited thereto but can also be utilized for semiconductor integrated circuit devices comprising logic circuits alone.

We claim:

1. A semiconductor integrated circuit device having a circuit delay time inspection function, comprising:
   a first latch circuit for latching an address signal;
   a memory circuit for outputting data accessed on receiving said address signal from said latch circuit;
   a second latch circuit for latching an output from said memory circuit;
   a first signal terminal for receiving a latch timing signal to be inputted to said first latch circuit for latching said address signal into said semiconductor integrated circuit device;
   a selection circuit having first and second input terminals, for outputting a signal inputted to either one of said first and second input terminals in accordance with a selection signal, said first signal terminal being connected to said first input terminal;
   a variable delay circuit having a variable delay time, connected to said selection circuit, and having an output thereof connected to said second input terminal of said selection circuit; and
   a second signal terminal for receiving said output of said delay circuit;
   wherein said output of said delay circuit is connected, as a latch timing signal, to said second latch circuit, and said selection circuit and said delay circuit are so connected in a closed loop as to constitute a ring oscillator through said second input terminal.

2. A semiconductor integrated circuit device according to claim 1, further comprising:
   a frequency division circuit connected between said output of said delay circuit and said second signal terminal, for providing a signal obtained by dividing the frequency of said output.

3. A semiconductor integrated circuit device according to claim 1, wherein each of said first and second latch circuits includes a control input, and exhibits either one of a latch function and a buffer function in accordance with a signal to said control input.

4. A semiconductor integrated circuit device according to claim 1, wherein said delay circuit includes a plurality of first delay circuit devices having a first delay time and cascaded with one another and a plurality of second delay circuit devices having a second delay time, which is some fractions of said first delay time, and cascaded with one another, and provides a variable total delay time in accordance with a control input.

5. A semiconductor integrated circuit device according to claim 1, wherein said selection circuit and said delay circuit have a differential input/output construction, and a differential output of said delay circuit is connected in an opposite polarity to a differential input of said selection circuit.

6. A semiconductor integrated circuit device according to claim 1, wherein the output of said delay circuit is connected to the input of an inverter, and the output of said inverter is connected to said second input terminal.

7. A semiconductor integrated circuit device according to claim 1, further comprising:

a logic circuit connected between said memory circuit and said second latch circuit.

8. A semiconductor integrated circuit device having a circuit delay time inspection function, comprising:
   a first latch circuit, having a timing input, for latching an address signal;
   a memory circuit for outputting data accessed on receiving said address signal from said first latch circuit;
   a second latch circuit, having a timing input, for latching an output from said memory circuit; and
   a ring oscillator connected between the timing inputs of said first and second latch circuits, and containing a variable delay circuit in a loop thereof:
   wherein a delay output of said delay circuit is connected as a latch timing signal to said second latch circuit.

9. A semiconductor integrated circuit device according to claim 8, further comprising:
   a frequency division circuit connected to said delay output of said delay circuit, for providing a signal obtained by dividing the frequency of said delay output.

10. A semiconductor integrated circuit device according to claim 8, further comprising:
   a timing signal terminal for inputting a timing signal inputted to said timing input of said first latch circuit; and
   a selection circuit contained in said ring oscillator circuit, for receiving an output of said variable delay circuit and said timing signal to said timing signal terminal, and for providing either one of them to the input of said variable delay circuit.

11. A semiconductor integrated circuit device according to claim 8, wherein said first and second latch circuits each has a control input, and effects either one of a latch function and a buffer function in accordance with a signal to said control input.

12. A semiconductor integrated circuit device according to claim 8, further comprising:
   a third latch circuit for latching a data signal;
   a logic circuit operated on receiving the data signal of said third latch circuit; and
   a fourth latch circuit for latching an output from said logic circuit;
   wherein said ring oscillator circuit is connected between said latch timing inputs of said third and fourth latch circuits.

13. A semiconductor integrated circuit device according to claim 12, wherein said third and fourth latch circuits each has a control input, and effects either one of a latch function and a buffer function in accordance with a signal to said control input.

14. A semiconductor integrated circuit device according to claim 8, wherein said delay circuit includes a plurality of first delay circuit devices having a first delay time and cascaded with one another and a plurality of second delay circuit devices having a second delay time, which is some integer fractions of said first delay time, and cascaded with one another, and provides a variable total delay time in accordance with a control input.

15. A semiconductor integrated circuit device according to claim 14, wherein said integer is 4, and said semiconductor integrated circuit device includes three of said first delay circuit devices and three of said second delay circuit devices.

16. A semiconductor integrated circuit device comprising:
   latch circuits disposed as pre-and post-stage circuits for a to-be-inspected circuit inside said semiconductor integrated circuit device; and
   a variable delay circuit capable of changing a delay time in accordance with an instruction given by outside;
   wherein a first timing signal applied to said pre-stage latch circuit is delayed by said variable delay circuit and the delayed timing signal is inputted to said post-stage latch circuit so that a delay time of said to-be-inspected circuit can be inspected, an output signal of said variable delay circuit is fed back to an input terminal of said variable delay circuit through selection circuits in such a manner as to form an oscillation circuit, and an oscillation signal of said oscillation circuit can be outputted outside said semiconductor integrated circuit device.

17. A semiconductor integrated circuit device according to claim 16, which further comprises;
   a first external input terminal to which an external timing signal as said first timing signal is to be supplied;
   a second external input terminal to which an external timing signal as a second timing signal for said post-stage latch circuit is to be supplied; and
   a pair of said selection circuits are provided such that one is disposed between said first external input terminal and said variable delay circuit and the other of which is disposed between said second external input terminal and said post-stage latch circuit; and
   wherein either of said second timing signal from said second external input terminal and said delayed timing signal delayed by said variable delay circuit can be supplied selectively to said post-stage latch circuit.

18. A semiconductor integrated circuit device according to claim 16, wherein said variable delay circuit capable of forming an oscillation circuit is disposed in common for a plurality of to-be-inspected circuits.

19. A semiconductor integrated circuit device according to claim 16, wherein said oscillation signal of said oscillation circuit can be outputted to outside through a frequency division circuit.

20. A semiconductor integrated circuit device according to claim 16, wherein both of said latch circuits are so constituted as to be capable of changing an operation for latching an input signal by a control signal and an operation for allowing said input signal to pass as such therethrough.

* * * * *